United States Patent

Canteloup et al.

[11] Patent Number: 5,898,500
[45] Date of Patent: Apr. 27, 1999

[54] DEVICE AND METHOD FOR THREE-DIMENSIONAL MEASUREMENTS AND OBSERVATION IN SITU OF A SURFACE LAYER DEPOSITED ON A THIN-FILM STACK

[75] Inventors: Jean Canteloup, Monthlery; Roland Kleim, Metz, both of France

[73] Assignee: Instruments, S.A., Paris, France

[21] Appl. No.: 08/915,672

[22] Filed: Aug. 21, 1997

[30] Foreign Application Priority Data

Feb. 26, 1997 [FR] France ................................... 97 02283
May 7, 1997 [FR] France ................................... 97 05672

[51] Int. Cl.$^6$ ....................................................... G01B 9/02
[52] U.S. Cl. ........................................... 356/357; 356/351
[58] Field of Search ..................................... 356/357, 351, 356/359, 360

[56] References Cited

U.S. PATENT DOCUMENTS

| | | | |
|---|---|---|---|
| 5,392,116 | 2/1995 | Makosch | 356/351 |
| 5,469,259 | 11/1995 | Golby et al. | 356/351 |
| 5,710,631 | 1/1998 | Bou-Ghannam et al. | 356/360 |
| 5,784,163 | 7/1998 | Lu et al. | 356/351 |

*Primary Examiner*—Robert Kim
*Attorney, Agent, or Firm*—Smith, Gambrell & Russell; Beveridge, DeGrandi, Weilacher & Young Intellectual Property Group

[57] ABSTRACT

Device and method for three-dimensional measurements and observation of a surface layer of a thin-film structure, comprising a monitoring unit 4 which includes a video camera 12, a wide-beam illumination source 14, a narrow-beam illumination source, 20, an operation and control unit and a table for horizontal movement. The device comprises a Wollaston prism 24 arranged on the optical path of the narrow light beam, in order to obtain two narrow light beams whose polarization states are linear and mutually orthogonal, a polarizer 27 arranged on the optical axis of the Wollaston prism 24 so that the reflected narrow light beam passes through it after its travel through the Wollaston prism 24, and a detection cell 28.

12 Claims, 4 Drawing Sheets

DEVICE AND METHOD FOR THREE-DIMENSIONAL MEASUREMENTS AND OBSERVATION IN SITU OF A SURFACE LAYER DEPOSITED ON A THIN-FILM STACK

The present invention relates to a device and a method for taking three-dimensional geometrical measurements, in situ, from a surface layer of a thin-film structure in a vacuum chamber, and also for measuring the change in the said structure during an etching or deposition process.

Among the applications of the invention, mention may be made of controlling, in situ and in real time, the fabrication of semiconductor layers with deep etching into silicon, for example for the fabrication of electrical Microsystems or for thinning microdiaphragms intended for the fabrication of microsensors.

French Patent Application No. 2,680,414 (SOFIE) discloses a compact assembly for observations and simultaneous interferometric measurements by laser, making it possible to take interferometric measurements in situ from a stack of thin films placed in a vacuum chamber. The assembly comprises an observation camera whose objectives are passed through, on the one hand, by an illumination beam and, on the other hand, by one or two laser beams for interferometric measurements.

By virtue of this technique it is, in particular, possible to position the laser beam on the layer to be studied and to measure the rate of increase or decrease in thickness of the surface layer of the thin-film structure. However, the monochromatic illuminating light beam and the measuring laser beam do not have exactly the same wavelength, which creates an achromatism problem making simultaneous focusing for the two light beams possible only if the objectives are achromatic. Furthermore, this technique does not allow absolute measurement of the thickness of the surface layer in the region which is observed, because it is based on a differential interferometric measurement which is repeated modulo a period close to $\lambda/2n$, $\lambda$ being the observation length and n the refractive index of the surface layer.

In addition, French Patent Application No. 2,718,231 (SOFIE) discloses a method for monitoring the thickness of a localized region of the surface layer of a thin-film structure, which can measure the absolute thickness of the surface layer in a specific analysis region by performing a spectral analysis using a spectrograph of a light beam originating from a white-light beam reflected by the thin-film stack. This technique is effective, but it only makes it possible to ascertain the thickness of the layer, and the rate at which it varies, over a localized region for depths of at most a few tens of microns.

The object of the present invention is to provide an improved technique which can take the measurements carried out according to the prior art, but is also suited to patterns having large thickness or depth for applications in micromechanics. This need arises because, when the layers are thick or when the patterns are deep, the intensity of the light to be measured becomes very small and conventional techniques are no longer suitable.

A further object of the invention is to provide a device and a method which can take an instantaneous measurement of the difference in level between a surface chosen as the origin and the etched or deposited pattern.

The device according to the invention is intended for three-dimensional measurement and observation in situ and in real time of a surface layer of a thin-film structure undergoing treatment in a vacuum chamber equipped with a window on one wall. The device comprises a monitoring unit which includes a compact casing enclosing a video camera, a wide-beam illumination source, a narrow-beam illumination source and optical components, an operation and control unit including an optical connector and an electrical connector which are mounted on the casing of the monitoring unit in order to connect it, respectively via a fibre-optic cable and an electrical cable, to the operation and control unit, and a table mounted above the treatment chamber in order, on the one hand, to move the monitoring unit horizontally along two axes in order to choose a site and, on the other hand, to provide accurate positioning so that the two incident beams and the two beams reflected by the surface layer follow neighbouring optical paths close to the optical axis of the video camera. The device comprises a Wollaston prism arranged on the optical path of the narrow light beam in order to obtain, at the exit of the said Wollaston prism, two narrow and coherent polarized light beams having different directions offset by an angle $\alpha$ and having orthogonal polarizations, the Wollaston prism being arranged so that the narrow light beams reflected by the layer pass through it, a polarizer arranged on the optical axis of the Wollaston prism so that the reflected narrow light beam passes through it after its return travel through the said Wollaston prism, the said polarizer being mounted so that it can rotate with respect to the said Wollaston prism, and a detection cell.

Two narrow light beams are thus available, one, for example, directed at a portion of the surface layer which is not being treated, and the other, for example, directed at a portion of the surface layer which is undergoing treatment. Rotating the polarizer about its optical axis makes it possible to select one or other of the polarized reflected beams, or a combination of the two, and to carry out an analysis making it possible to ascertain the difference in level between the two portions of the surface layer.

In one embodiment of the invention, the Wollaston prism can move in translation and is mounted on a rotary frame which also supports the polarizer, so that rotation of the Wollaston prism leads to rotation of the polarizer, the latter being mounted on a support that can rotate with respect to the said frame. Rotating the frame of the Wollaston prism makes it possible to rotate the two specific regions of the surface layer which are illuminated by the two narrow light beams, around the optical axis within the site illuminated by the wide light beam.

In one embodiment of the invention, the device comprises a laser beam for generating the narrow light beam, more particularly for measuring very deep patterns.

In another embodiment of the invention, the device comprises a white source for generating the narrow light beam.

Advantageously, the Wollaston prism is provided with an angular separation $\alpha$ of the two beams amounting to between 10 and 100 minutes of arc.

In one embodiment of the invention, the device comprises a diaphragm which is arranged between the polarizer and the detection cell, the hole of the said diaphragm having a diameter corresponding to that of the reflected narrow light beam. The diaphragm thus serves as a spatial filter by reducing the light lying outside the trajectory of the reflected narrow light beam. As a variant, the diaphragm may be replaced by an assembly which comprises two diaphragms and an intermediate lens and is placed in front of the detection cell.

In one embodiment of the invention, the device comprises an interference filter arranged in front of the detection cell, the passband of the filter corresponding to the wavelength of the reflected narrow light beam. This provides frequency filtering, which is advantageous when a laser beam is used.

One embodiment of the invention. provides a modulator of the polarization of the light of the two reflected narrow beams, which is arranged upstream of the polarizer on the route of the said reflected narrow beams and is in the form of a rotating quarter-wave plate, with a view to measuring the phase difference between the two beams, the said phase difference being representative of the difference in level between the regions of the surface layer on which the two narrow beams are reflected.

The method according to the invention is intended for measurement and observation in situ and in real time of a surface layer of a thin-film structure placed in a vacuum chamber equipped with a window on one wall.

The method consists:

in sending a wide illumination light beam on to a site of the structure to be observed, a first narrow illumination light beam on to a first specific region of the structure to be observed and a second narrow illumination light beam on to a second specific region of the structure to be observed, the beams following neighbouring optical paths close to the optical axis of a video camera and passing through the window of the treatment chamber to reach the site, the first and second narrow light beams being coherent with one another and their directions being offset by an angle α, said first and second narrow light beams being generated by a single light source;

in sending the light beam reflected by the site of the thin-film structure to a matrix sensor of a wide-field video camera, and the two light beams, reflected by the two specific regions and following the common optical path, to a means capable of combining them optically, the combined reflected light beams interfering at the exit of a polarizer followed by a detection cell with a view to measuring the difference in level between the two specific regions.

A narrow light beam obtained from a single source may be sent to a Wollaston prism in order to obtain the first and second incident narrow light beams, and the two reflected narrow light beams may be sent to the Wollaston prism in order to combine them on a single optical axis while maintaining the orthogonality of their respective polarizations, the polarizer being capable of moving in rotation through an angle of at least 90° so as to be able to select the first reflected narrow light beam in a single polarization, the second reflected narrow light beam in a single polarization, offset by 90° with respect to the polarization of the first beam, and the combination of the two reflected narrow light beams in an angular position offset by of the order of 45° with respect to the first.

Advantageously, the distance between the two specific regions may be adjusted by translating the Wollaston prism, and they are moved in rotation by rotating the Wollaston prism and the polarizer.

The Wollaston prism belongs to the category of polarization state splitters. The emergent beams are deviated on either side of the average direction of the incident ray, but these deviations are not strictly symmetrical.

For example, if a Wollaston prism of angular separation α equal to 30 minutes of arc is chosen, specific regions offset by about 450 microns are obtained at a distance of 20 cm from the structure. Moving in translation the Wollaston prism in the camera makes it possible to adjust this separation. Rotating the Wollaston prism makes it possible to move the two specific regions. It is thus easy to choose one specific region on a portion of the surface layer which is covered by a mask and is therefore spared by the treatment, and the other specific region in a portion undergoing etching. It is, of course, possible to take a plurality of measurements on different portions of the site which is undergoing etching. The site can be changed using the horizontally moving table.

If a specific region is arranged on an edge between a portion which is undergoing etching and a portion which is covered by the mask, a diffraction phenomenon will be produced, and this can be observed on the monitoring camera, allowing the specific region to be moved slightly in order to avoid this phenomenon. The mask covering a part of the thin-film structure is transparent to the wavelengths used, with a selectivity with respect to the structure itself of the order of 50. When the selectivity between the etched material and the mask is greater than 10, the etching of the mask does not affect the precision of the measurements. The camera serves both to ascertain the positioning of the beams and to take geometrical measurements by virtue of the digitizing which it carries out. Furthermore, the etching process may have a tendency to widen the portions not covered by the mask, by attacking its edges, or else to hollow out a masked portion at the edge of a portion undergoing etching, by attacking under the mask. Developments of this type are observed in real time by means of image processing and interferometry, because they entail a change in contrast over time. Two successive images of the sample may be compared in order to prevent this possible contrast change. The stability of the mask is checked, in real time, in the horizontal plane along the X and Y axes and in depth. This provides three-dimensional information regarding the change in the patterns of the sample.

After reflection from the sample, the two beams available at the exit of the Wollaston prism are characterized by:

linear and mutually orthogonal polarization states, different amplitudes ex and ey, a phase shift $\Delta$.

The different amplitudes originate not only from the different natures of reflection from the sample, but also from the action of the assembly elements, in particular the camera, which depends on the polarization of the beam.

The phase shift $\Delta$ originates primarily from:

the difference in level between the regions of the surface layer from which the narrow beams are reflected, the different natures of the reflections from the sample, the elements of the assembly.

To obtain satisfactory precision, the three contributions are separated by a suitable calibration procedure.

The phase shift $\Delta$ is a phase shift between the amplitudes of two beams, at two different points on the sample.

In the case of the rotary quarter-wave plate, two measurements of the phase shift will be taken, the first where the two beams are reflected from the same plane, giving a value $\Delta_1$, and the second where the two beams are reflected from different planes, giving a value $\Delta_2$. The difference in level between the planes is connected with these phase-shift values: $\Delta_2 - \Delta_1 = (2\pi/\lambda) 2e$, $\lambda$ being the wavelength of the beams and e being the vertical distance between the planes. The influence of the original phase shift can thus be eliminated. The device is capable of measuring thin patterns on the sample, which gives it an extremely large measuring range.

The invention will be understood more clearly on studying the detailed description of an embodiment, taken by way of entirely non-limiting example and illustrated by the appended drawings, in which.

The Applicant Company has developed a very compact assembly for observations and simultaneous interferometric measurements by laser, in particular on thin-film structures, a technique which is presented in detail in French Patent Applications No. 2,680,414 and No. 2,718,231, the reader being invited to refer to them for further details regarding the equipment and the basic operation of the device.

Figure 1:
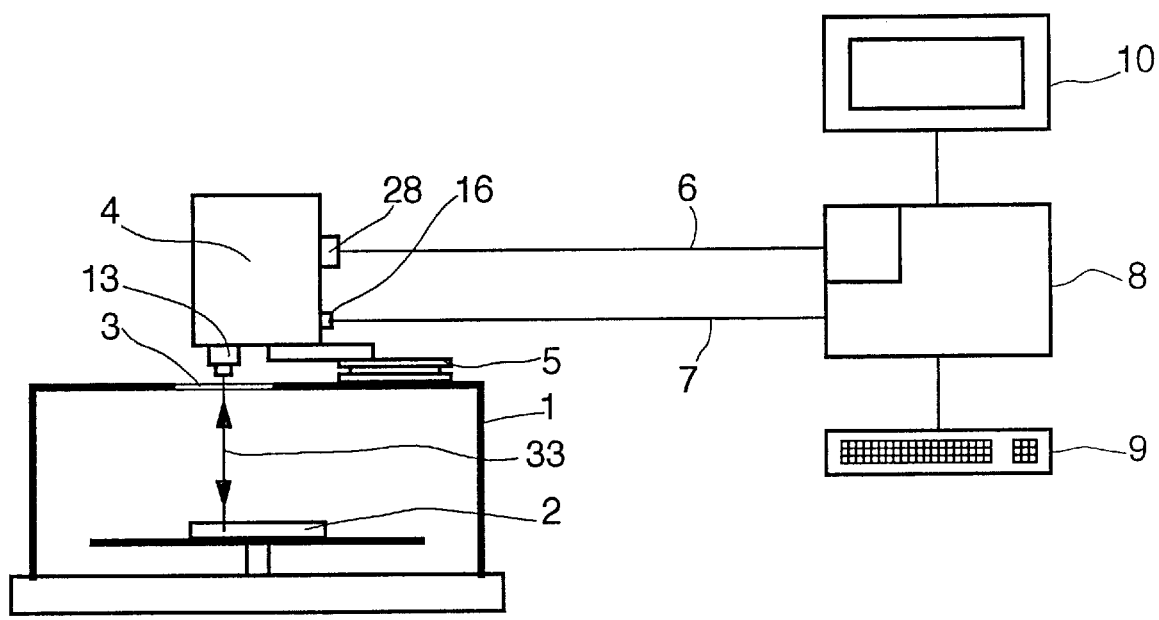
FIG. 1 is an explanatory diagram of the equipment used for the method of the invention.

As shown in FIG. 1, a vacuum treatment chamber encloses a sample 2 to be treated, for example a silicon wafer which is being plasma-etched to obtain a diaphragm, and includes a silica window 3 in its upper wall. A monitoring unit 4 is mounted above the treatment chamber 1, on a table 5 having horizontal X-Y movement. The monitoring unit 4 is connected by an optical fibre 6 and an electrical cable 7 to an operation and control unit 8 with which a control keyboard 9 and a display screen 10 are associated. The unit 8 is connected to two electrical stepper motors (not shown) for controlling the horizontal movement of the monitoring unit 4 on the table 5.

Figure 2:
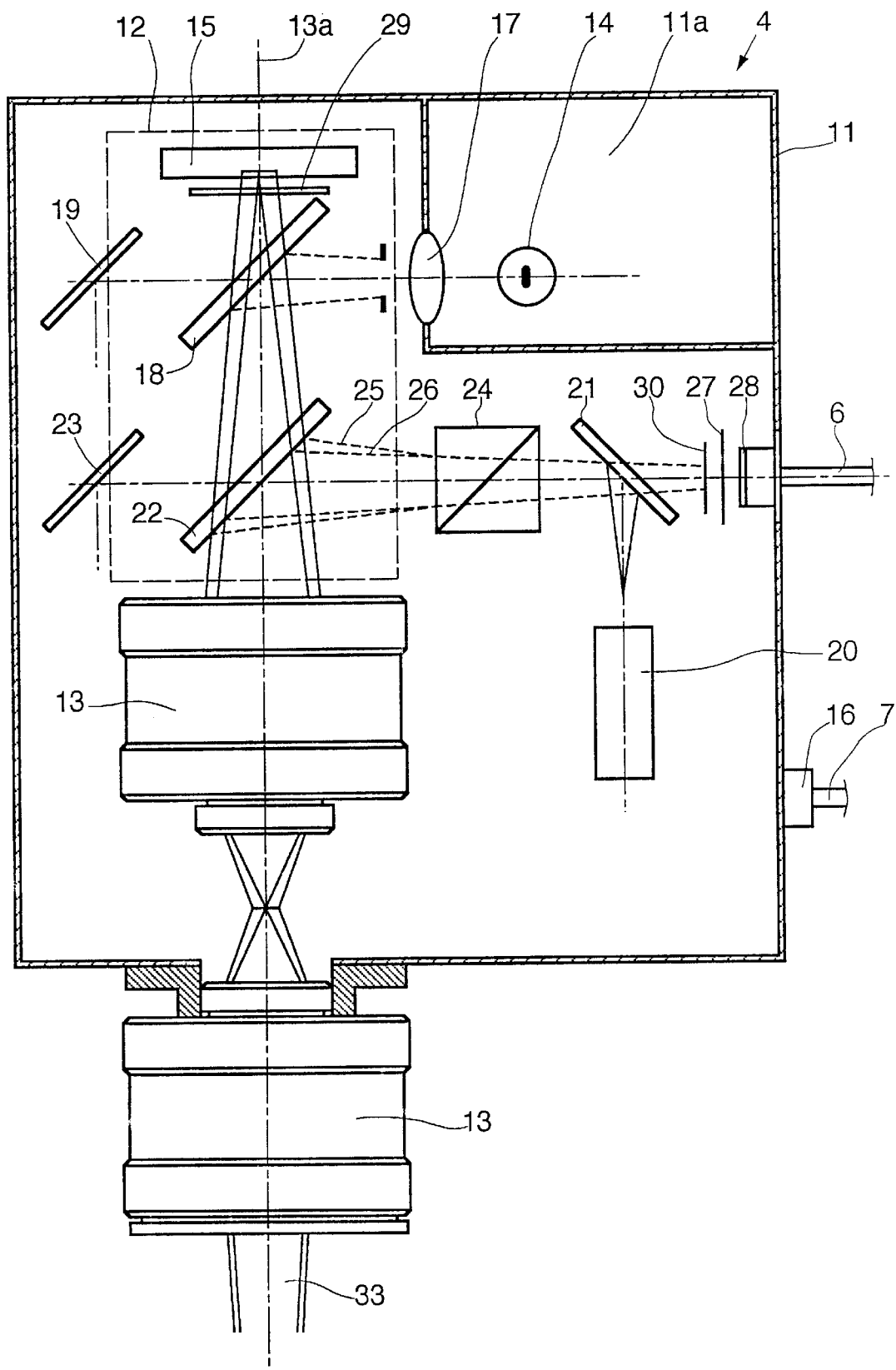
FIG. 2 is an explanatory diagram of the device of the invention.

As can be seen in more detail in FIG. 2, the monitoring unit 4 has a casing 11 which encloses a video camera 12, the adjustable objective 13 of which may be of the autofocus type, a wide-beam illumination source 14 and a number of optical plates for guiding the light beams along predetermined optical paths. The video camera 12 includes a sensor 15, preferably consisting of a plurality of CCD cells arranged in a matrix. The sensor 15 is connected (in a manner not shown) to an electrical connector 16 for the electrical cable 7, with a view to delivering a digital video signal to the operation and control unit 8 in order to be displayed on the screen 10, the electrical connector 16 being mounted on the casing 11.

The casing 11 includes an interior compartment 11a containing the illumination source 14 which emits in a spectrum preferably having at least partial overlap with the visible light spectrum. To simplify the following description, reference will be made to the white light emitted by the illumination source 14. The interior compartment 11a has a window provided with an optical lens 17 that directs the illumination light beam at a semi-transparent plate 18 arranged between the objective 13 and the sensor 15 of the camera 12, so that the illumination light beam follows the optical path of the camera, that is to say the optical axis 13a of the objective 13. A first light trap 19, in the form of a plate, is placed behind the semi-transparent plate 18 with a view to absorbing the part of the illumination light beam that has passed through the semi-transparent plate 18 and thus to reduce the optical disturbance in the monitoring unit 4.

The laser-beam source 20 includes a diode laser and emits a narrow beam which is projected via a semi-transparent plate 21 on to another semi-transparent plate 22 interposed in the optical route between the objective 13 and the sensor 15 of the camera 12, so that the laser beam also follows the optical path of the camera 12, which coincides with the optical axis 13a of the objective 13. Another light trap 23, in the form of a plate, is arranged behind the semi-transparent plate 22.

As a variant, provision may be made to replace the laser source 20 by a white-light source using a xenon arc, which may be arranged outside the casing 11 and connected to it via an optical fibre (not shown).

A Wollaston prism 24 is arranged on the route of the laser beam emitted by the source 20, between the semi-transparent plate 21 and the semi-transparent plate 22. The effect of this prism is to split the beam output by the laser source 20 into two narrow beams 25 and 26 which have an angular separation of 30 minutes of arc and whose polarization states are linear and mutually orthogonal. Two coherent laser beams are thus provided. For the sake of clarity, the angular offset of the beams 25 and 26 has been deliberately exaggerated in FIG. 2. The linear polarizations are conserved along the route, on condition that the linear polarization directions on leaving the Wollaston prism are indeed respectively parallel and perpendicular to the plane of incidence on the plate 22, otherwise each of the beams will take on an elliptical polarization.

Thus, the compact casing 11 of the monitoring unit 4 encloses the video camera 12 with the illumination source 14 and the laser-beam source 20 for emitting a light beam composed of the illumination light beam emitted by the illumination source 14 and narrow laser beams 25 and 26 which are emitted by the laser-beam source 20 and are split by the Wollaston prism 24, along an optical path passing through the objective 13 of the camera 12. The combined light beam is sent by the monitoring unit 4 through the objective 13 and the window 3 of the treatment chamber 1 to arrive on the thin-film structure sample 2 (FIG. 1).

The light beam reflected by the sample 2 passes through the objective 13 to enter the casing 11 of the monitoring unit 4. The semi-transparent plate 22 splits the reflected light beam into two parts. A first, transmitted part arrives at the sensor 15 of the camera 12 after having passed through the semi-transparent plates 22 and 18. A part reflected by the plate 22 passes through the Wollaston prism 24, which causes the two reflected narrow laser beams to be combined into a single beam. The single reflected laser beam at the exit of the Wollaston prism 24 passes through a polarizer 27 to reach a detection cell 28 connected by an optical fibre 6 to the operation unit 8.

The reflected beam, directed at the sensor 15 of the camera 12, corresponds to the spectrum of the illumination light beam, with two high-intensity reflected laser beams. In order to prevent dazzling of the sensor 15, and therefore of the video camera 12, by the effect of the reflected laser beams, a filter 29 is arranged on the optical route of the camera 12, just in front of the sensor 15.

The optical filter 29 is transparent for a characteristic wavelength and opaque for the other wavelengths, so as to transmit only substantially monochromatic light to the sensor 15 of the camera 12. Thus, each CCD cell of the sensor 15 behaves individually as an interferometer representing a pixel of the plane image of the camera 12. The video camera 12 thus behaves as a plurality of interferometers mounted in a matrix, and thus delivers a video signal which is displayed on the screen 10 and which corresponds to a monochromatic map representing the surface of the illuminated site of the sample 2. Preferably, the characteristic wavelength of the optical filter 29 is chosen close enough to the wavelength of the reflected laser beams in order for the two laser spots inside the illuminated localized region also to be displayed on the screen 10 without them dazzling the video camera 12.

Interference of the beams is possible by virtue of the polarizer 27, on to the transmission axis of which the electric field vectors of the two beams are projected. On exit, this provides phase-shifted colinear vibrations which can interfere, unlike the electric fields before the polarizer, which are orthogonal and therefore incapable of interfering, even if the corresponding rays exactly coincide.

The polarizer 27 is in the form of a film which includes dichroic particles that absorb light for a first direction of the electromagnetic field, and transmit for a second direction, orthogonal to the first. Since the polarizations of the reflected laser beams are not altered by their travel through the Wollaston prism 24, rotation of the polarizer 27 makes it possible, in a first angular position, to select one of the reflected laser beams; in a second position, offset by 90° with respect to the first, to select the second reflected laser beam; and in a third position, offset by of the order of 45° with respect to the first, to analyse the two reflected laser beams, and in particular their interference. The detection cell 28 may be of various types, and in particular a spectrograph.

In front of the polarizer 27, provision may be made to mount a diaphragm 30 whose hole has a diameter corresponding to that of the reflected laser beams, so as to limit the detection by the detection cell 28 of the light originating from the source 14. It is also possible to provide an interference filter (not shown) arranged between the polarizer 27 and the detection cell 28 in order to avoid the filter having an effect on the polarization, the passband of which filter corresponds to the wavelength of the source 20 so as to reduce the light of other colours also originating, directly or through reflection, from the source 14. This improves the signal to noise ratio of the detection cell 28, in particular when use is made of a xenon arc that is rich in the blue range, whereas the source 14 is rich in the red range and analysis is carried out in the latter range.

Figure 3:
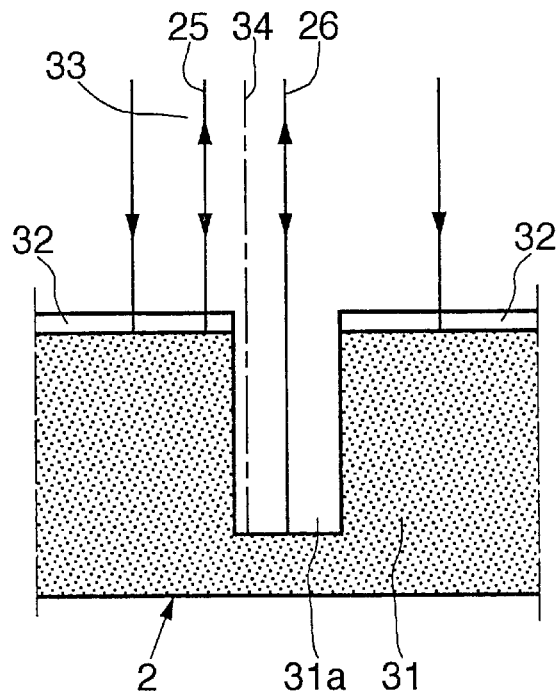
FIG. 3 is a view in section of the thin-film structure monitored according to the technique of the invention.
Figure 4:
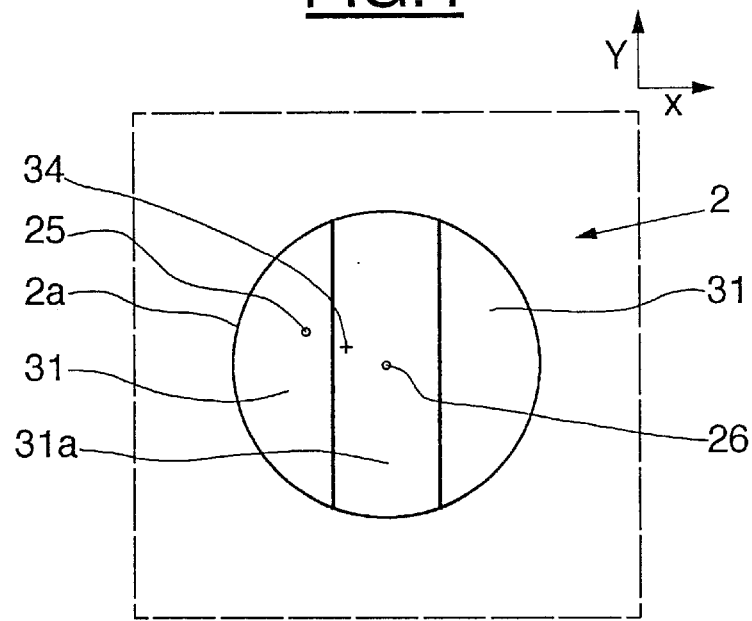
FIG. 4 is a plan view corresponding to FIG. 3.

FIGS. 3 and 4 schematically show images representative of the method of the invention. The sample 2 to be treated is a thin-film structure used in fabricating diaphragms by etching. The sample 2 comprises a silicon substrate 31, some parts of which are protected by a mask 32. That region 31a of the substrate 31 which is not protected by the mask 32 is attacked by a plasma process, known per se, to a predetermined thickness.

The incident light beam emitted by the monitoring unit 4 illuminates a site 2a on the upper surface of the sample 2. The site 2a is delimited by the white-light illumination beam 33. The first laser beam 25 reaches the sample 2 on a region protected by the mask 32. Since the mask 32 is transparent to light, the laser beam 25 is reflected from the surface of the substrate 31 arranged under the mask 32. The second laser beam 26 is reflected from the region 31a of the substrate 31 which is undergoing etching. The position of the laser beams 25 and 26 is displayed on the screen of the monitoring unit 4, and they can thus be moved so that one is reflected from a region protected by the mask 32 and the other is reflected from a trench which is being etched into the substrate 31.

The laser beams 25 and 26 are shifted with respect to the sample 2, on the one hand by shifting the table 5 in a horizontal plane, and on the other hand by moving the Wollaston prism 24. The Wollaston prism 24 can move in translation along its optical axis, which makes it possible to adjust the separation between the laser beams 25 and 26 on the sample 2. The Wollaston prism 24 is mounted on a rotary frame (not shown) which makes it possible to move the laser beams 25 and 26 by rotation about their original axis 34. The polarizer 27 is also mounted on the rotary frame of the Wollaston prism 24. Rotating the Wollaston prism 24 causes the polarizer 27 to rotate, so that moving the laser beams 25 and 26 does not alter the adjustment of the polarizer 27. The polarizer 27 is mounted on a support (not shown) which can rotate with respect to the frame of the Wollaston prism 24. The polarizer 27 is thus adjusted independently of the Wollaston prism 24.

Because of the difference in the distances which the two reflected laser beams travel, due to the etching depth of the exposed region 31a of the substrate 31 of the sample 2, the intensity of the two reflected laser beams is not absolutely equal after they have passed through the Wollaston prism 24, which reduces the contrast of the interference fringes. When it is desired to study the interference between the two reflected laser beams, the polarizer 27 is then set to an angle which may be slightly different from 45°, so as to balance the intensity of the components originating respectively from the two reflected laser beams. The difference in intensity of the reflected laser beams may also be partly due to the reflection from the plate 22, during which the polarization parallel to the plane of incidence on the plate 22 is favoured.

The phase shift between the beams originates, on the one hand, from the reflection from the sample 2, this being the useful phase shift which makes it possible to measure a layer thickness or an etching depth, and, on the other hand, from the reflection and transmission through the plates 21 and 22 and the Wollaston prism 24, especially if the latter is not properly centred. In monochromatic light (laser), calibration can be carried out by directing the two beams at a single surface of the sample 2.

A polarization cube, or a second Wollaston prism, may be arranged on the optical path of the reflected beam, after its return travel through the Wollaston prism 24, in order to separate the beams spatially according to their polarization, measure their amplitudes $R_x$ and $R_y$ separately and calculate their ratio. A polarization cube permits a spatial separation by an angle of 90°. A Wollaston prism made of calcite allows a spatial separation by an angle of several degrees.

Figure 5:
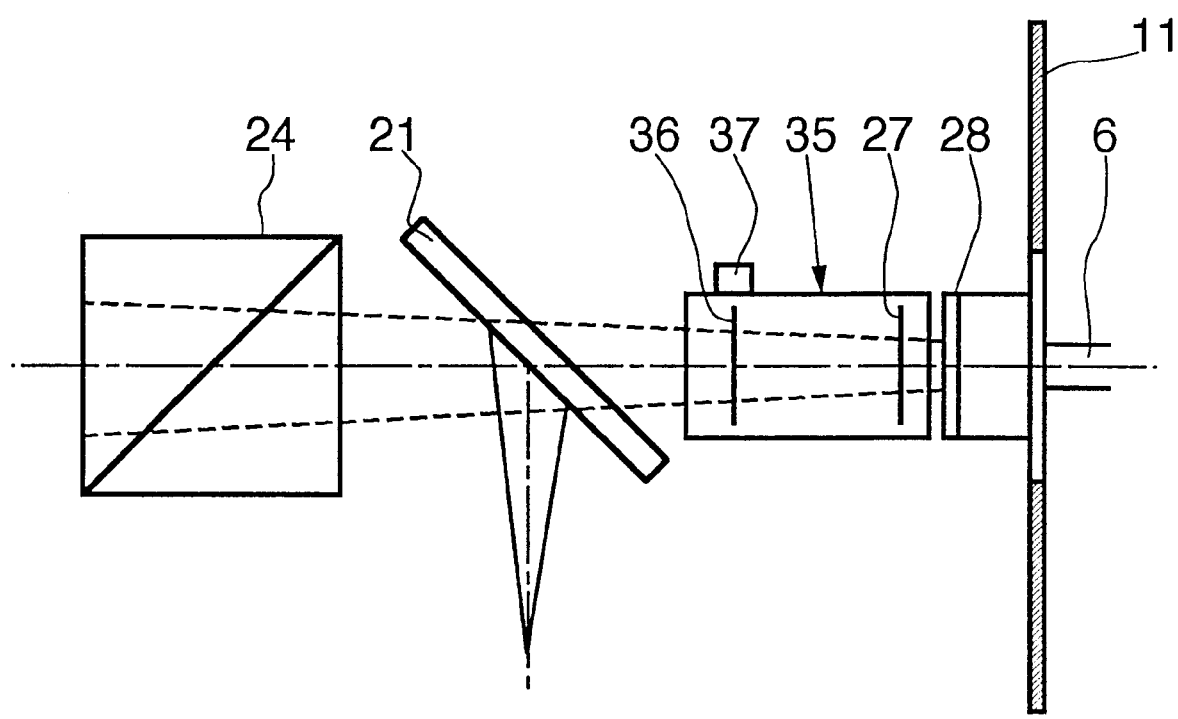
FIG. 5 shows a variant of FIG. 2.

As illustrated in FIG. 5, the camera 12 comprises an assembly 35 which supports the polarizer 27 and a quarter-wave plate 36 which is rotated about its centre by an electric motor 37 in order to modulate the polarization of the light. This provides information relating to the modification of surface conditions on the sample.

By virtue of the invention, deep etching operations on semiconductor layers can be monitored with two laser beams which are coherent because they originate from a single source. A precise measurement of the etching depth is thus taken. Before the start of the etching, it is possible to observe a plurality of patterns of the sample by successively aiming at each of them, in order to deduce therefrom a model of the sample which is beneficial for a large-scale industrial etching process.

We claim:

1. Device for three-dimensional measurements and observation in situ and in real time of a surface layer of a thin-film structure undergoing treatment in a vacuum chamber (1) equipped with a window on one wall, comprising a monitoring unit (4) which includes a compact casing enclosing a video camera (12), a wide-beam illumination source (14), a narrow-beam illumination source (20) and optical components, an operation and control unit (8) including an optical connector and an electrical connector which are mounted on the casing of the monitoring unit in order to connect it, respectively via a fibre-optic cable and an electrical cable, to the operation and control unit, and a table (5) mounted above the treatment chamber in order, on the one hand, to move the monitoring unit horizontally along two axes (X, Y) in order to choose a site and, on the other hand, to provide accurate positioning so that the two incident beams and the two beams reflected by the surface layer follow neighbouring optical paths close to the optical axis of the video camera, characterized in that it comprises a Wollaston prism (24) arranged on the optical path of the narrow light beam in order to obtain, at the exit of the said Wollaston prism, two narrow and coherent polarized light beams (25, 26) having different directions offset by an angle α and having orthogonal polarizations, the Wollaston prism being arranged so that the narrow light beams reflected by the layer pass through it, a polarizer (27) arranged on the optical axis of the Wollaston prism so that the reflected narrow light beam passes through it after its return travel through the said Wollaston prism, the said polarizer being mounted so that it can rotate with respect to the said Wollaston prism, and a detection cell (28).

2. Device according to claim 1, characterized in that the Wollaston prism can move in translation and is mounted on a rotary frame which also supports the polarizer, so that rotation of the Wollaston prism leads to rotation of the polarizer, the latter being mounted on a support that can rotate with respect to the said frame.

3. Device according to claim 1, characterized in that it comprises a laser beam for generating the narrow light beam.

4. Device according to claim 1, characterized in that it comprises a white source for generating the narrow light beam.

5. Device according to claim 1, characterized in that it comprises a diaphragm (29) which is arranged between the Wollaston prism and the polarizer and whose hole has a diameter corresponding to that of the reflected narrow light beam.

6. Device according to claim 1, characterized in that it comprises an assembly which is provided with two diaphragms and an intermediate lens and is placed in front of the detection cell.

7. Device according to claim 1, characterized in that it comprises an interference filter arranged between the polarizer and the detection cell, the passband of the filter corresponding to the frequency of the reflected narrow light beam.

8. Device according to claim 1, characterized in that it comprises a modulator of the polarization of the light of the two reflected narrow beams, which is arranged upstream of the polarizer on the route of the said reflected narrow beams and is in the form of a rotating quarter-wave plate, with a view to measuring the phase difference between the two beams, the said phase difference being representative of the difference in level between the regions of the surface layer on which the two narrow beams are reflected.

9. Method for measurement and observation in situ and in real time of a surface layer of a thin-film structure placed in a vacuum chamber equipped with a window on one wall, characterized in that it consists in:

sending a wide illumination light beam on to a site of the structure to be observed, a first narrow illumination light beam on to a first specific region of the structure to be observed and a second narrow illumination light beam on to a second specific region of the structure to be observed, the beams following neighbouring optical paths close to the optical axis of a video camera and passing through the window of the treatment chamber to reach the site, the first and second narrow light beams being coherent with one another and their directions being offset by an angle α, said first and second narrow light beams being generated by a single light source, sending the light beam reflected by the site of the thin-film structure to a matrix sensor of a wide-field video camera, and the two light beams, reflected by the two specific regions and following the common optical path, to a means capable of combining them optically, the combined reflected light beams interfering at the exit of a polarizer followed by a detection cell with a view to measuring the difference in level between the two specific regions characterized in that a narrow light beam obtained from a single source is sent to a Wollaston prism in order to obtain the first and second incident narrow light beams, and in that the two reflected narrow light beams are sent to the Wollaston prism in order to combine them on a single optical axis while maintaining the orthogonality of their respective polarizations, the polarizer being capable of moving in rotation through an angle of at least 90° so as to be able to select the first reflected narrow light beam in a single polarization, the second reflected narrow light beam in a single polarization, offset by 90° with respect tot he polarization of the first beam, and the combination of the two reflected narrow light beams in an angular position offset by of the order of 45° with respect to the first.

10. Method according to claim 9, in which the difference in level of the two regions is measured by determining the phase difference between the two reflected light beams, said phase difference being determined by modulating the polarization of the two reflected light beams with a rotating quarter-wave plate which is located between the polarizer and the Wollaston prism which recombines the two reflected light beams into a single beam.

11. Method according to claim 10, characterized in that the distance between the two specific regions is adjusted by translating the Wollaston prism, and they are moved in rotation by rotating the Wollaston prism and the polarizer.

12. Method according to claim 9, characterized in that the two reflected light beams pass through a means for modulating polarization before entry into the polarizer.

* * * * *